United States Patent [19]
Okamoto

[11] Patent Number: 6,017,396
[45] Date of Patent: Jan. 25, 2000

[54] PLASMA FILM FORMING APPARATUS THAT PREVENTS SUBSTANTIAL IRRADIATION DAMAGE TO THE SUBSTRATE

[75] Inventor: Tetsuya Okamoto, Taki-gun, Japan

[73] Assignee: Sharp Kabushiki Kaisha, Osaka, Japan

[21] Appl. No.: 08/691,512

[22] Filed: Aug. 2, 1996

[30] Foreign Application Priority Data

Aug. 4, 1995 [JP] Japan .................................. 7-200058

[51] Int. Cl.⁷ .................................................. C23C 16/00
[52] U.S. Cl. .............. 118/719; 118/723 E; 118/723 ER; 118/723 R
[58] Field of Search .............................. 118/719, 723 R, 118/723 MW, 723 ME, 723 E, 723 ER, 723 IR, 723 I; 204/298.25

[56] References Cited

U.S. PATENT DOCUMENTS

| | | | |
|---|---|---|---|
| 4,274,936 | 6/1981 | Love .................................. | 204/198.13 |
| 4,461,783 | 7/1984 | Yamazaki .................................. | 427/39 |
| 4,615,298 | 10/1986 | Yamazaki .................................. | 118/723 R |
| 4,738,761 | 4/1988 | Bobbio et al. .................................. | 204/192.12 |
| 4,828,369 | 5/1989 | Hotomi .................................. | 350/357 |
| 5,114,529 | 5/1992 | Masuyama et al. .................................. | 156/643 |
| 5,147,520 | 9/1992 | Bobbio .................................. | 204/192.33 |
| 5,174,881 | 12/1992 | Iwasaki et al. .................................. | 204/298.25 |
| 5,180,435 | 1/1993 | Markunas et al. .................................. | 118/723 IR |
| 5,288,329 | 2/1994 | Nakamura et al. .................................. | 118/729 |
| 5,292,393 | 3/1994 | Maydan et al. .................................. | 156/345 |
| 5,556,501 | 9/1996 | Collins et al. .................................. | 156/345 |
| 5,620,523 | 4/1997 | Maeda et al. .................................. | 118/723 IR |
| 5,679,167 | 10/1997 | Muehlberger .................................. | 118/723 DC |
| 5,707,486 | 1/1998 | Collins .................................. | 156/643.1 |
| 5,707,692 | 1/1998 | Suzuki .................................. | 427/562 |
| 5,720,821 | 2/1998 | Halpern .................................. | 118/719 |
| 5,780,313 | 7/1998 | Yamazaki .................................. | 437/235 |
| 5,795,399 | 8/1998 | Hasegawa et al. .................................. | 134/1.3 |

FOREIGN PATENT DOCUMENTS

| | | |
|---|---|---|
| 2-54225 | 4/1990 | Japan . |
| 3-162571 | 7/1991 | Japan . |
| 3-232224 | 10/1991 | Japan . |
| 6-77144 | 3/1994 | Japan . |
| 6-122983 | 5/1994 | Japan . |

*Primary Examiner*—Jeffrie R Lund
*Attorney, Agent, or Firm*—Dike, Bronstein, Roberts & Cushman, LLP; George W. Neuner

[57] ABSTRACT

A film formation device for forming a film on a substrate according to the present invention includes: a plurality of vacuum chambers, each of the plurality of vacuum chambers including a gas introduction section for introducing a reactive gas, a plasma generation section for generating a plasma, and a support member for supporting the substrate. The plasma generation section in at least one of the plurality of vacuum chambers is disposed at a predetermined position for preventing the substrate from sustaining substantial irradiation damage by the generated plasma.

5 Claims, 9 Drawing Sheets

FIG. 1

PRIOR ART

PLASMA FILM FORMING APPARATUS THAT PREVENTS SUBSTANTIAL IRRADIATION DAMAGE TO THE SUBSTRATE

BACKGROUND OF THE INVENTION

1. Field of the Invention

The present invention relates to a film formation device for forming a thin film on a substrate such as a glass substrate (for use in a liquid crystal display device, for example) and a semiconductor substrate composed of silicon or the like (for use in a semiconductor device).

2. Description of the Related Art

One type of known film formation device for forming a thin film on a substrate is a plasma device. In a conventional plasma device, a thin film is formed on a substrate as follows: After gas is introduced in a chamber, the gas in the chamber is discharged by means of a vacuum pump until a predetermined pressure (vacuum level) is realized. A plasma is generated while the pressure within the chamber is maintained. From this plasma, a desired thin film is formed on a substrate which is placed in the chamber.

When forming a thin film by a plasma process, the substrate on which the thin film is formed is susceptible to damage due to ion bombardment, electrostatic discharge damage, and the like. Such damage is likely to occur at the beginning or the end of the plasma process, when the plasma is in an unstable state. In order to control such damage, a technique has been proposed which generates a plasma in a high frequency state (e.g., Japanese Laid-Open Patent Publication No. 6-122983).

Figure 1:
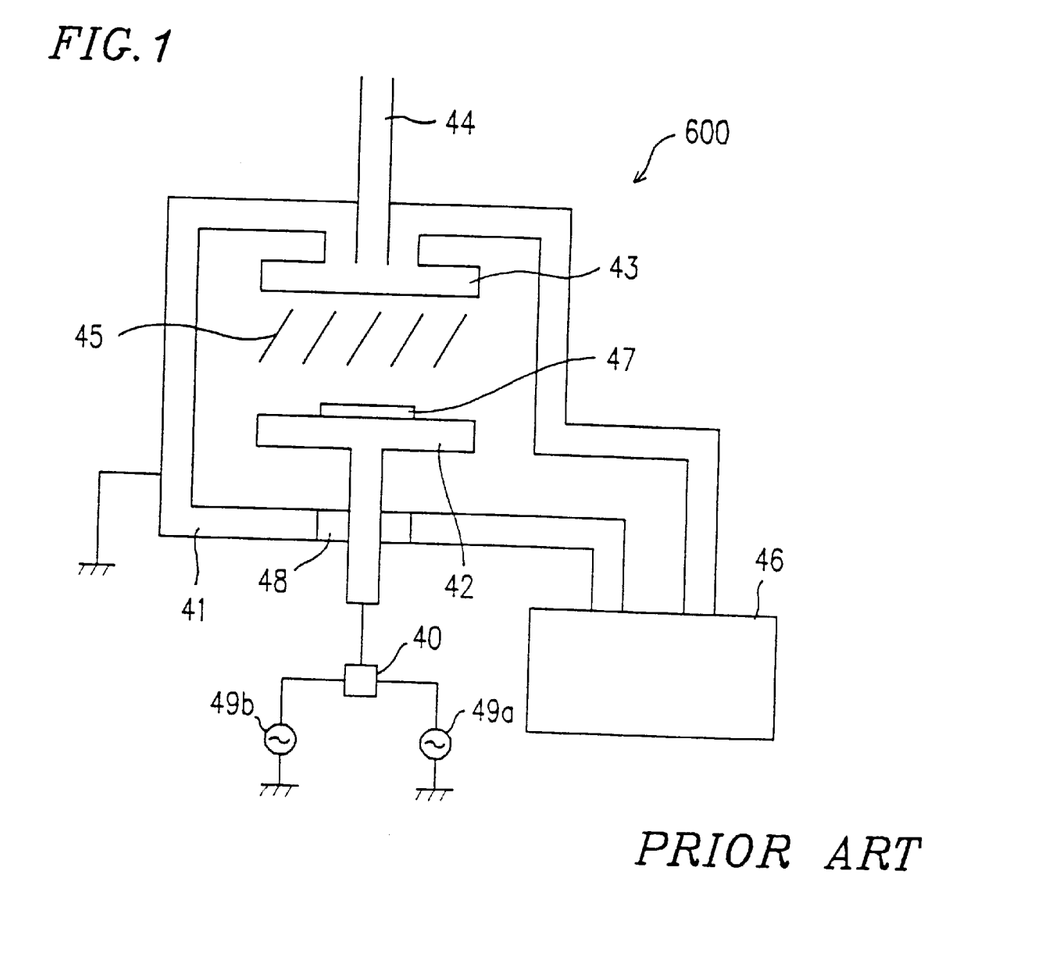
FIG. 1 is a schematic view showing a conventional plasma device.

FIG. 1 shows an example of the above-mentioned conventional plasma device. As shown in FIG. 1, the plasma device 600 includes a chamber 41. A gas mixture is introduced into the chamber 41 through an opening 44 to replace the atmosphere inside the chamber 41. A vacuum pump 46 is used to discharge the gas inside the chamber 41, whereby the pressure therein is maintained at a constant level. A cathode 42 and an anode 43 are disposed so as to oppose each other inside the chamber 41. High-frequency power supplies 49a and 49b having different frequencies are coupled to the cathode 42 via a switch 40, which selects one of the two frequencies in accordance with an instruction from a controller (not shown) provided in the plasma device 600. The chamber 41 is insulated from the cathode 42 with the use of an insulation member 48.

An RF electric field applied between the cathode 42 and the anode 43 generates a plasma 45. The plasma 45 is utilized for forming a film, or performing an etching on a substrate 47 placed on the cathode 42.

The plasma device 600 selectively uses one of the high-frequency power supplies 49a and 49b (by means of the switch 40) at different stages of the plasma film formation or plasma etching process, in an attempt to reduce the damage which likely occurs at the beginning or the end of the plasma process.

However, in accordance with the above plasma device 600, in which the frequency of the supply power is changed during the formation or processing of a thin film, the surface of the substrate 47 (on which the film is to be formed) is still exposed to the plasma. As a result, an interface state is created in the substrate 47 due to irradiation damage. In the case of an MOS type device such as a thin film transistor (TFT), such an interface state present at the interface between a gate electrode insulation film and a channel layer may disadvantageously vary the flat band voltage ($V_{FB}$) of the TFT. A variation in the $V_{FB}$ in turn causes the threshold voltage $V_{th}$ to vary as shown in the following equation (1):

$$V_{th} = 2\phi f + V_{FB} + \sqrt{\{2K\epsilon qNa(2\phi f)\}}/Co \qquad (1)$$

where $\phi f$: a Fermi potential difference
 K: a relative dielectric constant of the semiconductor
 $\in$: a dielectric constant of a vacuum
 q: charge amount of electrons
 Na: accepter density
 Co: capacitance of the insulation film.

As a result, the device is likely to have an insufficient quality, and hence result in a low production yield.

SUMMARY OF THE INVENTION

A film formation device for forming a film on a substrate according to the present invention includes: a plurality of vacuum chambers, each of the plurality of vacuum chambers including a gas introduction section for introducing a reactive gas, a plasma generation section for generating a plasma, and a support member for supporting the substrate, wherein the plasma generation section in at least one of the plurality of vacuum chambers is disposed at a predetermined position for preventing the substrate from sustaining substantial irradiation damage by the generated plasma.

In one embodiment of the present invention, the plasma generation section in the at least one vacuum chamber includes an electric field generation section disposed between the gas introduction section and the support member in the vicinity of the gas introduction section, and the plasma is generated by an electric field generated by the electric field generation section, the plasma being generated in a position sufficiently distant from the substrate so as to prevent the substrate from sustaining substantial irradiation damage caused by the plasma.

In another embodiment of the present invention, the at least one vacuum chamber includes a second gas introduction section for introducing a reactive gas between the electric field generation section and the support member.

In another embodiment of the present invention, the plasma generation section in the at least one vacuum chamber generates the plasma in a predetermined width for forming the film smaller than a width of the substrate, and the support member includes a movable portion for moving the substrate with respect to the plasma generation section so that the film is formed on substantially the entire surface of the substrate as the moving portion moves.

In another embodiment of the present invention, an ultrasonic wave cleaning chamber is provided following the at least one vacuum chamber, the ultrasonic wave cleaning chamber removing residual reaction products present on a surface of the film formed on the substrate.

A method for forming a film on a substrate by using a film formation device including a plurality of vacuum chambers according to the present invention includes the steps of: introducing a reactive gas at a gas introduction position in at least one vacuum chamber; supporting the substrate at a predetermined support position in the at least one vacuum chamber; and generating a plasma of the reactive gas in the at least one vacuum chamber in a predetermined position for preventing the substrate from sustaining substantial irradiation damage by the generated plasma.

In one embodiment of the present invention, the method further includes the steps of: generating an electric field in an electric field generation position between the gas introduction position and the predetermined support position of the substrate in the vicinity of the gas introduction position in the at least one vacuum chamber; and generating the plasma by the electric field in the at least one vacuum chamber so as to be in a position sufficiently distant from the substrate so as to prevent the substrate from sustaining substantial irradiation damage caused by the plasma.

In another embodiment of the present invention, the method further includes a step of: introducing a second reactive gas at a second gas introduction position between the electric field generation position and the predetermined support position of the substrate in the at least one vacuum chamber, whereby the second reactive gas reacts with radicals of the plasma.

In another embodiment of the present invention, the plasma is generated, in the at least one vacuum chamber, in a film formation region having a predetermined width smaller than a width of the substrate, and the substrate is moved so as to pass by the film formation region so that the film is formed on substantially the entire surface of the substrate.

In another embodiment of the present invention, the method further includes a step of: after the film is formed on the substrate in the at least one vacuum chamber, removing residual reaction products present on a surface of the film.

Thus, the invention described herein makes possible the advantage of providing a film formation device that can prevent plasma-induced damage from occurring on a material on which a film is formed (e.g., a substrate).

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

EXAMPLE 1

Figure 2:
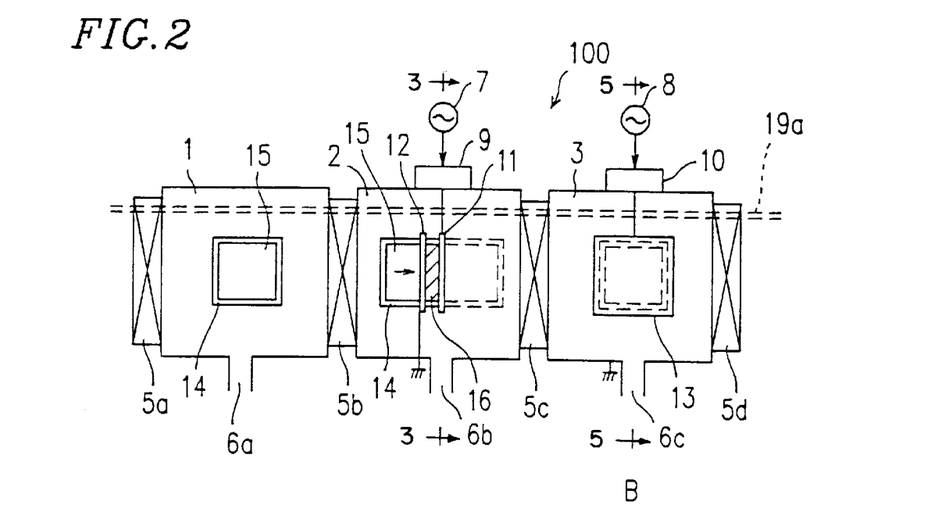
FIG. 2 is a schematic view showing a film formation device (CVD device) according to Example 1 of the present invention.

FIG. 2 is a schematic view showing the configuration of the film formation device 100 according to Example 1 of the present invention. The film formation device 100, which is a plasma CVD device, includes a preparation chamber 1, a first vacuum chamber 2, and a second vacuum chamber 3. The actual film formation process takes place in the first and second vacuum chambers 2 and 3. The preparation chamber 1 and the vacuum chambers 2 and 3 have vacuum openings 6a to 6c, respectively, all of which open into a vacuum pump (not shown). The chambers 1, 2, and 3 are connected to one another in series via partition valves 5b and 5c as shown in FIG. 2. A partition valve 5a is provided on a side of the preparation chamber 1 opposite the first vacuum chamber 2. A similar partition valve 5d is provided on a side of the second vacuum chamber 3 opposite the first vacuum chamber 2. The partition valves 5a to 5d are composed of stainless steel or aluminum and are capable of opening/closing. In an open state, each partition valve 5a to 5d functions as a passage connecting adjoining chambers. In a closed state, each adjoining pair of partition valves 5a to 5d functions to seal the corresponding chamber 1, 2, or 3 located therebetween.

Figure 3:
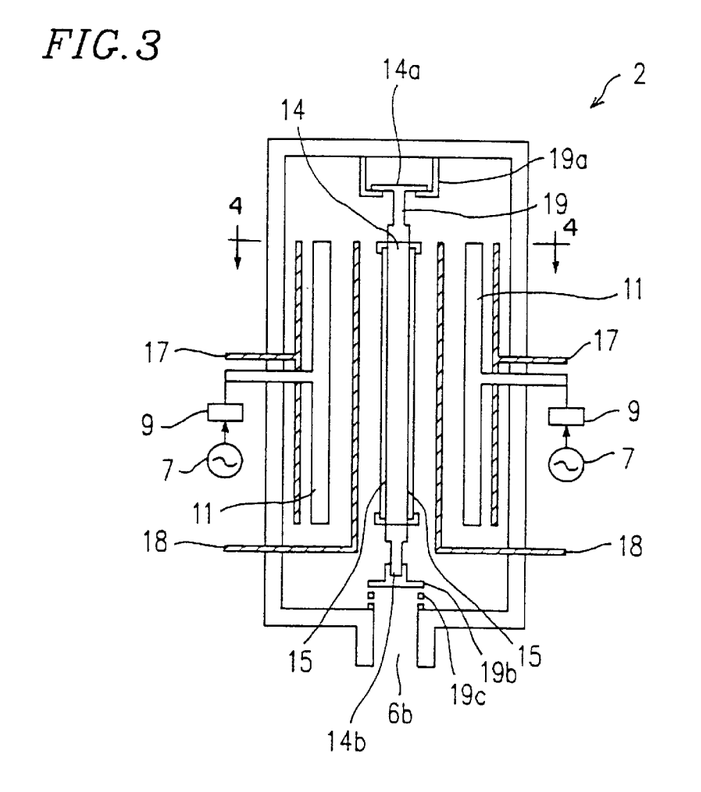
FIG. 3 is a vertical cross-sectional view taken along direction A of FIG. 2, showing the structure of a first vacuum chamber of the film formation device according to Example 1 of the present invention.
Figure 4:
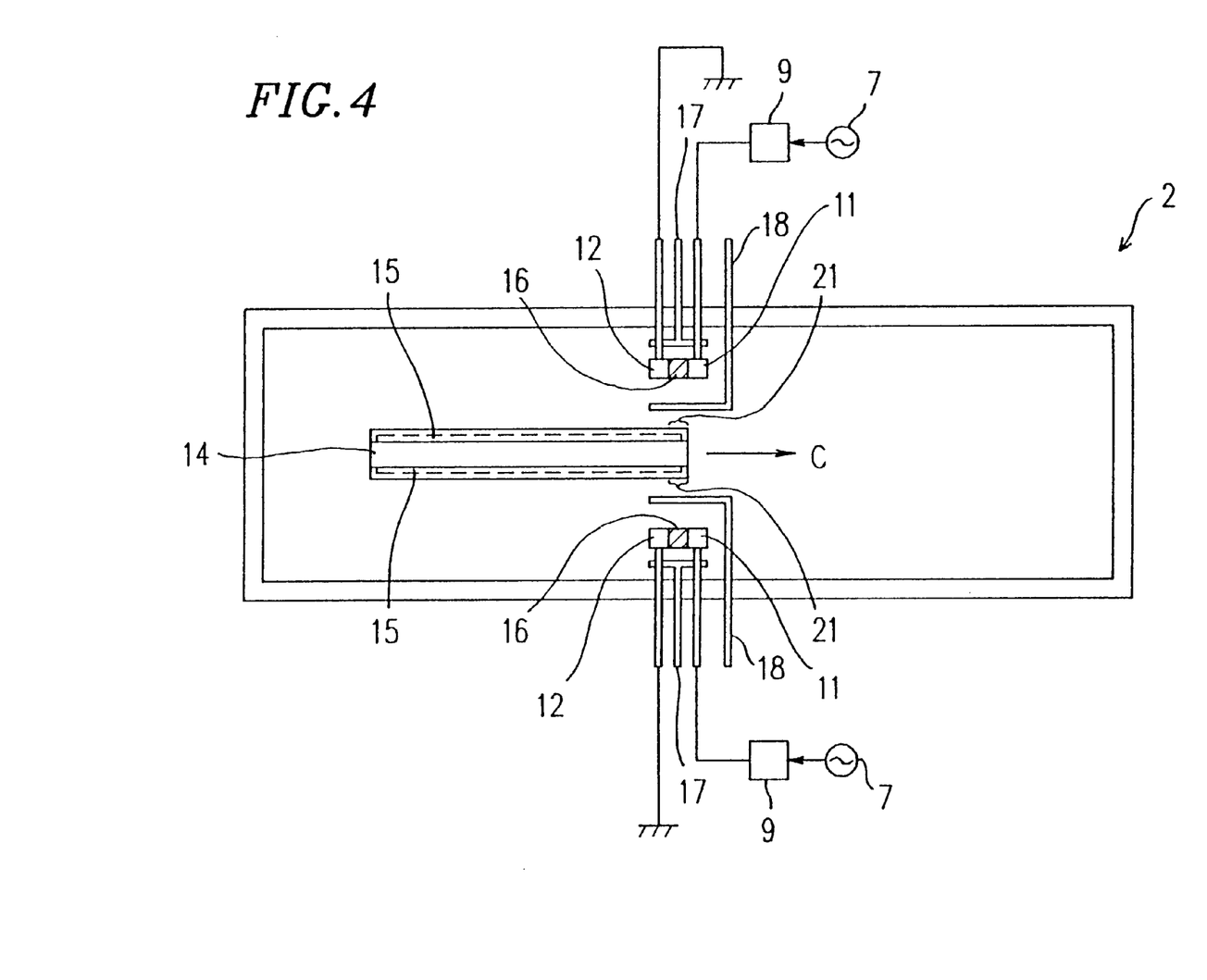
FIG. 4 is a cross-sectional view taken at line A'—A' in FIG. 3.
Figure 5:
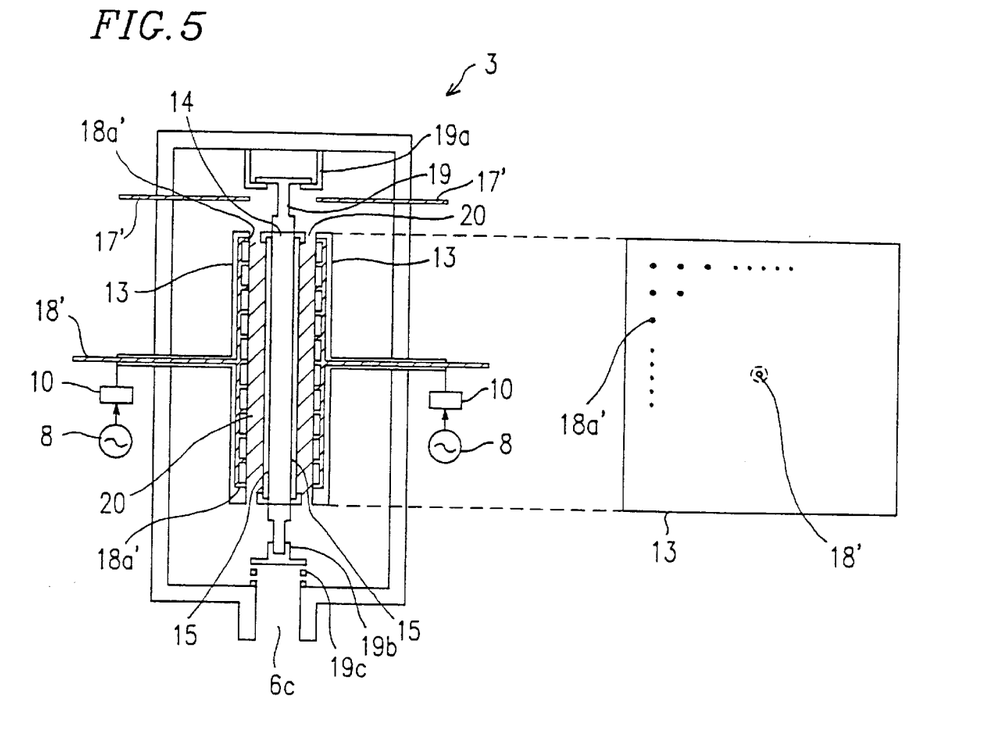
FIG. 5 is a vertical cross-sectional view taken along direction B of FIG. 2, showing the structure of a second vacuum chamber of the film formation device according to Example 1 of the present invention.

FIG. 3 is a vertical cross-sectional view showing the structure of the first vacuum chamber 2. FIG. 4 is a cross-sectional view (as seen from above) taken at line A—A in FIG. 3. FIG. 5 is a vertical cross-sectional view showing the structure of the second vacuum chamber 3.

As shown in FIGS. 2 to 5, a conveyer 19 is provided in the preparation chamber 1 and the vacuum chambers 2 and 3. The conveyer 19 carries substrates 15 into or out of the film formation device 100, with the corresponding partition valves 5a to 5d opening or closing accordingly. As shown in FIGS. 3 and 5, the conveyer 19 includes a guide/support portion 19a (located closer to the ceiling of the film formation device 100), a bottom guide portion 19b (located closer to the bottom of the film formation device 100), and a heater 14. The heater 14 includes an upper portion 14a which is movably supported and guided by the guide/support portion 19a, and a lower portion 14b which is guided by the guide portion 19b at the bottom. A spring 19c is provided beneath the guide portion 19b for providing upward force for the guide portion 19b. Thus, the heater 14 is movably supported by the guide/support portion 19a and the bottom guide portion 19b.

The guide/support portion 19a and the bottom guide portion 19b are formed so as to continuously extend from outside of the preparation chamber 1 to outside of the second vacuum chamber 3 (Only the guide/support portion 19a is shown in FIG. 2 by a broken line). The heater 14 carries the substrates 15 on both faces thereof (as shown in FIG. 2), and has a general plate shape slightly larger than each substrate 15. The heater 14 includes a predetermined means (not shown) for heating the substrates 15 disposed on the heater 14 to a predetermined temperature.

Although the film formation device 100 of the present example is described as processing two substrates 15 simultaneously in each chamber, the present invention provides no limitation as to the number of substrates 15 to be processed at one time. For conciseness, the following description will primarily be directed to the processing of only one substrate 15 and various members of the device 100 associated therewith; it will be appreciated that the same description applies to the other substrate 15 and members associated therewith.

As shown in FIG. 4, electrodes 11 and 12 are provided so as to oppose each other on each side of the conveyance path of the substrates 15 in the first vacuum chamber 2. The electrode 11 is coupled to an external high-frequency power supply 7 via a matching box 9, and the electrode 12 is grounded. Gas introduction tubes 17 and 18 for introducing reaction gases also are provided in the first vacuum chamber 2. The gas introduction tube 17 opens in a region between an inner wall of the first vacuum chamber 2 and the opposing electrodes 11 and 12. The gas introduction tube 18 opens in a region between the conveyance path of the substrates 15 and the opposing electrodes 11 and 12 so as to be closer to the conveyance path of the substrates 15.

As shown in FIG. 5, an electrode 13 is provided on each side of the conveyance path of the substrates 15 in the second vacuum chamber 3. The electrode 13 is coupled to an external high-frequency power supply 8 via a matching box 10. Also in the second vacuum chamber 3, gas introduction tubes 17' and 18' for introducing reaction gases are provided. As shown in FIG. 5, the gas introduction tube 17' opens above the electrode 13. The gas introduction tube 18' is formed inside the electrode 13, and includes a plurality of gas outlets 18a' disposed over the entire face of the electrode 13 opposing the substrate 15. As shown in FIGS. 2 and 5, the electrode 13 is formed so as to correspond to the entire face of the substrate 15.

Next, an exemplary process of forming a thin film on the substrate 15 using the film formation device 100 will be described.

First, the conveyer 19 places the substrate 15 into the preparation chamber 1 (having a vacuum degree of about $10^{-5}$ Pa), and is heated to about 350° C. by the heater 14.

Next, the conveyer 19 places the substrate 15 into the first vacuum chamber 2 (having a vacuum degree of about $10^{-5}$ Pa). After $O_2$ gas is introduced into the first vacuum chamber 2 through the gas introduction tube 17, an RF electric field is generated between the opposing electrodes 11 and 12, whereby an oxygen plasma 16 is generated (FIG. 4). After the generation of the oxygen plasma 16, $SiH_4$ gas is introduced into the first vacuum chamber 2 through the gas introduction tube 18. As a result, oxygen radicals generated from the oxygen plasma 16 react with the reactive $SiH_4$ gas, so that an $SiO_2$ film is formed on the substrate 15. Since the substrate 15 is not exposed to the oxygen plasma 16, which is generated in a space between the electrodes 11 and 12 as seen from FIG. 4, the substrate 15 is effectively prevented from being damaged by the oxygen plasma 16.

As shown in FIG. 4, the opposing electrodes 11 and 12 function to create a thin film (having a width 21) on the substrate 15. According to the present example, the width 21 of the resultant thin film is about 80 mm when the film is formed while keeping the substrate 15 stationary. As will be appreciated, the plasma 16 is generated in a relatively small region in the first vacuum chamber 2, as compared with the entire area of the substrate 15 (FIG. 2).

In practice, the conveyer 19 moves the substrate 15 (along the conveyance path) past the stationary electrodes 11 and 12 at a rate of about 100 mm/min (as indicated by arrow C in FIG. 4), so that a thin film is formed over the entire surface of the substrate 15. A film having a thickness of about 1000 angstroms can be obtained when the film formation process is performed for 5 minutes under a pressure of about 13 to about 133 Pa within the first vacuum chamber 2.

As seen from above, the $O_2$ gas introduced through the gas introduction tube 17 creates the plasma 16 in a relatively small region interposed between the electrodes 11 and 12 in the first vacuum chamber 2, so that the plasma 16 does not reach the vicinity of the substrate 15. As a result, irradiation damage due to the plasma 16 is minimized, thereby reducing the damage occurring at an interface between the substrate 15 and the film formed on the substrate 15 responsive to the $SiH_4$ gas.

After a thin film having a thickness of about 1000 angstroms has been formed in the first vacuum chamber 2 as described above, the conveyer 19 places the substrate 15 into the second vacuum chamber 3 having a vacuum degree of about $10^{-5}$ Pa (FIG. 5).

Oxygen ($O_2$) gas is introduced into the second vacuum chamber 3 through the gas introduction tubes 17' so as to generate a plasma 20 between the electrode 13 and the substrate 15, and $SiH_4$ gas is further introduced to the vicinity of the surface of the electrode 13 through the gas introduction tubes 18'. Taking advantage of the electrode 13 opposing the entire surface of the substrate 15, the substrate 15 is held stationary while an $SiO_2$ film is formed on the entire surface of the substrate 15. Thus, in the second vacuum chamber 3, high-speed film formation takes place as a result of using the large-area plasma 20. A film having a thickness of about 2000 angstroms can be obtained when the film formation process in the second vacuum chamber 3 is performed for about 1 minute under a pressure of about 13 to about 133 Pa within the second vacuum chamber 3.

Now, the respective film formation processes taking place in the first vacuum chamber 2 and the second vacuum chamber 3 will be described in more detail. When generating a plasma by using parallel planar electrodes, the spark voltage $V_s$ (which depends on the specific gas) is a function of a product of the gas pressure p and the distance L between the electrodes, according to Paschen's Law. In the case of $O_2$ gas, Paschen's Law derives the following: $V_s$=450 (V) and pL=0.7 (torr·cm). Accordingly, in the first vacuum chamber 2 (FIG. 4), where the $O_2$ gas has a pressure p of 0.1 torr, the distance L between the electrodes 11 and 12 is derived to be 7 cm.

In the first vacuum chamber 2, the electrodes 11 and 12 are not disposed so as to interpose the substrate 15, but rather disposed so as to oppose each other at a predetermined distance from the surface of the substrate 15. Therefore, the electrodes 11 and 12 function to generate the plasma 16 in a region (film formation region) corresponding to the distance L between the electrodes 11 and 12. In the present example, the film formation region extends about 8 cm (i.e., the film formation width 21). Therefore, in the case where each side of the substrate 15 is 50 cm long, the film formation region does not cover the entire surface of the substrate 15 but covers only the predetermined film formation width 21 (i.e., about 8 cm). This configuration provides an advantage in that the plasma 16 can be formed in a film formation region distant from the substrate 15, thereby minimizing the irradiation damage during the film formation process, although the film formation region is relatively small. The resultant film has excellent interfacial characteristics.

On the other hand, the second vacuum chamber 3 adopts the relative positioning of the electrode 13 as shown in FIG. 5 in order to provide a relatively wide film formation region, because the film formation for the surface 15 (interface) of the substrate has already been finished, where irradiation damage can be most eminent. Thus, the film formation in the second vacuum chamber 3 is performed by generating the large-area plasma 20 relatively close to the substrate 15 with the use of the electrode 13, which can cover the entire surface of the substrate 15. As a result, the overall film formation process finishes in a relatively short time, thereby reducing the tact time.

As described above, during the step of directly forming a film on the substrate 15 in the first vacuum chamber 2, the oxygen plasma 16 is generated in a region relatively distant from the substrate 15 before the introduction of the reactive $SiH_4$ gas in a region relatively close to the substrate 15. Therefore, this film formation process does not damage the surface of the substrate 15. Subsequent to the step in the first vacuum chamber 2 where a film of a predetermined thickness is directly formed on the substrate 15, a high-speed film formation step occurs in the second vacuum chamber 3 using the large-area plasma 20 so that the processing time is reduced. The high-speed film formation step using the large-area plasma 20 in the second vacuum chamber 3 is substantially harmless because the film (about 1000 angstroms thick) formed in the first vacuum chamber 2 serves to protect the surface of the substrate 15.

Moreover, in the film formation device 100 of the present example, the partition valves 5a to 5d function to seal and isolate the preparation chamber 1 and the first and second vacuum chambers 2 and 3 from one another. Therefore, each chamber 1 to 3 can maintain the desired vacuum degree, as well as excellent gas isolation and plasma isolation. This makes it possible for the film formation device 100 to simultaneously process three substrates 15 on each side of the conveyance path (each chamber 1 to 3 accommodating a different one of the three substrates 15), totaling six substrates being simultaneously processed on both sides of the conveyance path.

Although the high-frequency power supplies 7 and 8 employed for the film formation device 100 of the present example operate at a frequency of 13.56 MHz, the present invention does not provide any limitation as to the frequency thereof. For example, it is also applicable to employ a high-frequency power supply operating at 2.45 GHz to generate an ECR plasma for generating the oxygen plasma 16.

EXAMPLE 2

Figure 6:
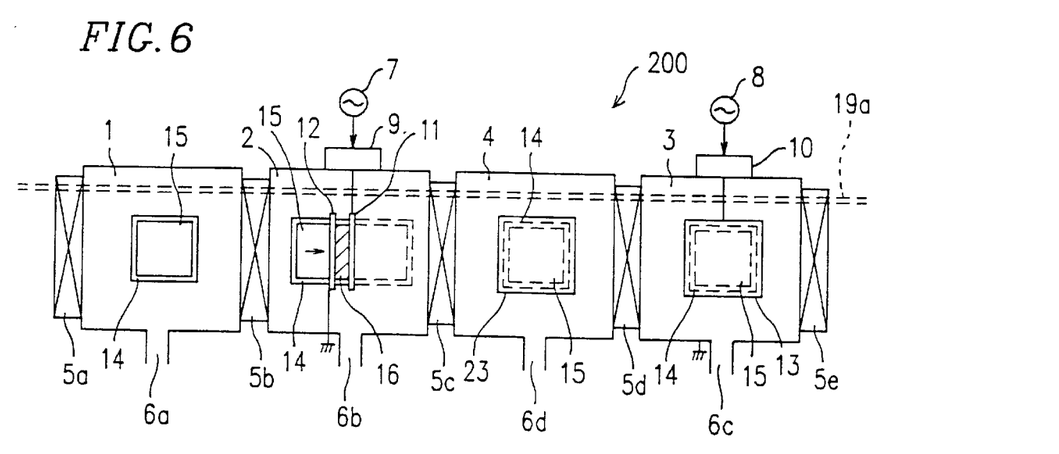
FIG. 6 is a schematic view showing a film formation device (CVD device) according to Example 2 of the present invention.

FIG. 6 is a schematic view showing the configuration of the film formation device 200 according to Example 2 of the present invention. The film formation device 200, which is a plasma CVD device, includes a preparation chamber 1, a first vacuum chamber 2, an ultrasonic wave cleaning chamber 4, and a second vacuum chamber 3. The actual film formation process takes place in the first and second vacuum chambers 2 and 3. The film formation device 200 has substantially the same construction as that of the film formation device 100 except for additionally including the ultrasonic wave cleaning chamber 4 between the first and second vacuum chambers 2 and 3.

As shown in FIG. 6, the preparation chamber 1, the vacuum chambers 2 and 3, and the ultrasonic wave cleaning chamber 4 have vacuum openings 6a to 6d, respectively, all of which open into a vacuum pump (not shown). As in Example 1, the preparation chamber 1, the vacuum chamber 2, the ultrasonic wave cleaning chamber 4, and the vacuum chamber 3 are connected to one another in series via partition valves 5b to 5d as shown in FIG. 6. A partition valve 5a is provided on a side of the preparation chamber 1 opposite from the first vacuum chamber 2. A similar partition valve 5e is provided on a side of the second vacuum chamber 3 opposite the ultrasonic wave cleaning chamber 4. The partition valves 5a to 5e are composed of stainless steel or aluminum and are capable of opening/closing. In an open state, each partition valve 5a to 5e functions as a passage connecting adjoining chambers. In a closed state, each adjoining pair of partition valves 5a to 5e functions to seal the corresponding chamber 1, 2, 3, or 4 located therebetween.

The preparation chamber 1 and the first and second vacuum chambers 2 and 3 of the film formation device 200 are identical with the preparation chamber 1 and the first and second vacuum chambers 2 and 3 of the film formation device 100 of Example 1.

In the film formation device 200, a conveyer 19 is provided so as to extend at least from the preparation chamber 1 through the vacuum chamber 3. (Only a guide/support portion 19a is shown in FIG. 6 by a broken line).

The ultrasonic wave cleaning chamber 4 accommodates a pair of ultrasonic wave cleaners 23, the ultrasonic wave cleaners 23 opposing respective substrates 15 carried along by the conveyer 19. The ultrasonic wave cleaner 23 removes the residual reaction products on the surface of the substrates 15 after a film formation process in the first vacuum chamber 2.

Although the film formation device 200 of the present example is described as processing two substrates 15 simultaneously in each chamber, the present invention provides no limitation as to the number of substrates 15 to be processed at one time. For conciseness, the following description will primarily be directed to the processing of only one substrate 15 and various members of the device 200 associated therewith; it will be appreciated that the same description applies to the other substrate 15 and members associated therewith.

In the present example (as well as in Example 1), the partition valves 5a to 5e function to seal and isolate the chambers 1, 2, 3, and 4 from one another. Therefore, each chamber 1 to 4 can maintain the desired vacuum degree, as well as excellent gas isolation and plasma isolation. This makes it possible for the film formation device 200 to simultaneously process four substrates 15 on each side of the conveyance path (each chamber 1 to 4 accommodating a different one of the four substrates 15), totaling eight substrates being simultaneously processed on both sides of the conveyance path.

Although high-frequency power supplies 7 and 8 employed for the film formation device 200 of the present example operate at a frequency of 13.56 MHz, the present invention does not provide any limitation as to the frequency thereof. For example, it is also applicable to employ a high-frequency power supply operating at 2.45 GHz to generate an ECR plasma for generating an oxygen plasma 16.

Although the ultrasonic wave cleaning chamber 4 is provided between the vacuum chambers 2 and 3 in the present example, a further ultrasonic wave cleaning chamber can be provided after the second vacuum chamber 3.

The number of vacuum chambers is not limited to two according to the present invention. Any number of vacuum chambers can be provided in accordance with the specific needs of the film formation process. In such cases, an ultrasonic wave cleaning chamber can be provided between any two vacuum chambers and in any position after the last vacuum chamber, if necessary.

EXAMPLE 3

Example 3 of the present invention illustrates a case in which the film formation device of the invention is applied to a sputtering device.

Figure 7:
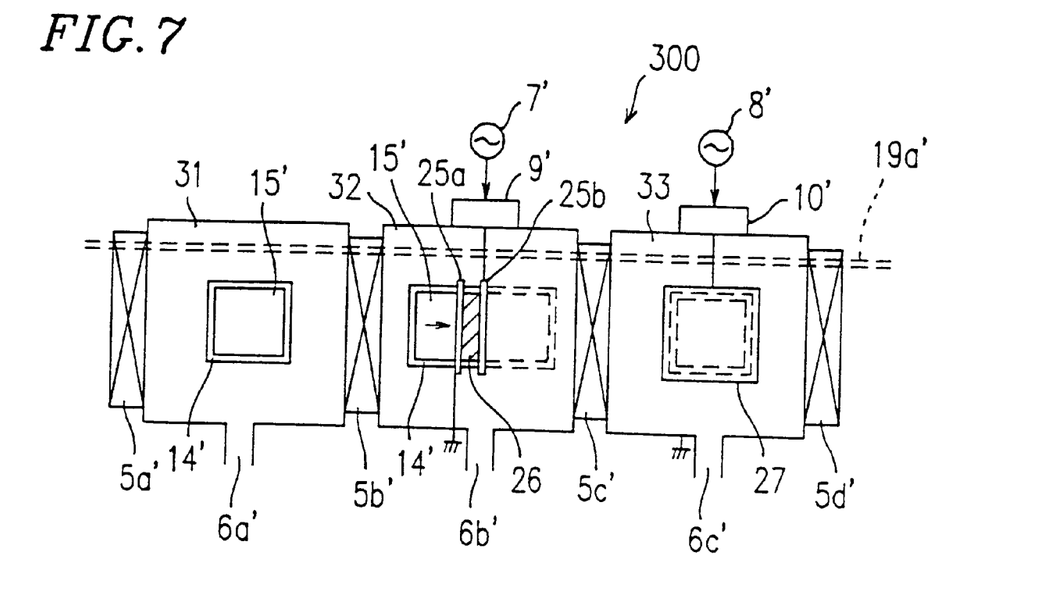
FIG. 7 is a schematic view showing a film formation device (sputtering device) according to Example 3 of the present invention.

FIG. 7 is a schematic view showing the configuration of the sputtering device 300 according to Example 3 of the present invention. The sputtering device 300 includes a preparation chamber 31, a first vacuum chamber 32, and a second vacuum chamber 33. The actual sputtering process takes place in the first and second vacuum chambers 32 and 33. The preparation chamber 31 and the vacuum chambers 32 and 33 have vacuum openings 6a' to 6c', respectively, all of which open into a vacuum pump (not shown). The chambers 31, 32, and 33 are connected to one another in series via partition valves 5b' and 5c' as shown in FIG. 7. A partition valve 5a' is provided on a side of the preparation chamber 31 opposite the first vacuum chamber 32. A similar partition valve 5d' is provided on a side of the second vacuum chamber 33 opposite the first vacuum chamber 32. The partition valves 5a' to 5d' are composed of stainless steel or aluminum and are capable of opening/closing. In an open state, each partition valve 5a' to 5d' functions as a passage connecting adjoining chambers. In a closed state, each adjoining pair of partition valves 5a' to 5d' functions to seal the corresponding chamber 31, 32, or 33 located therebetween.

Figure 8:
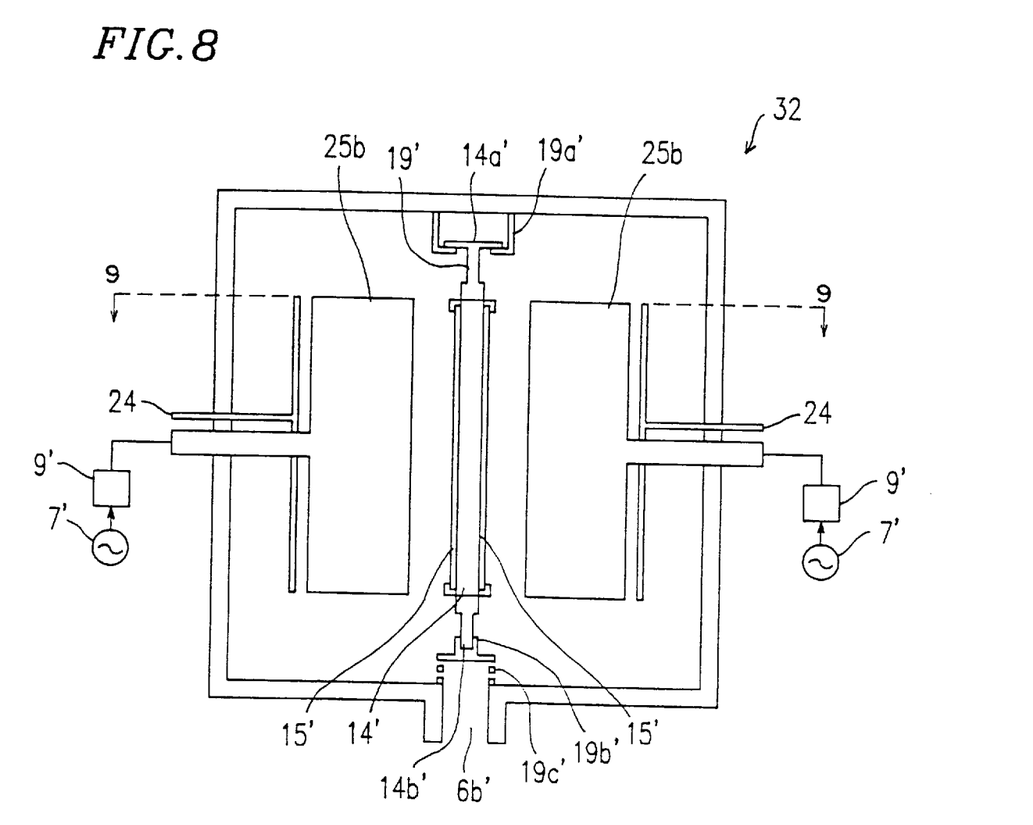
FIG. 8 illustrates the structure of a first vacuum chamber of the film formation device (sputtering device) according to Example 3 of the present invention.
Figure 9:
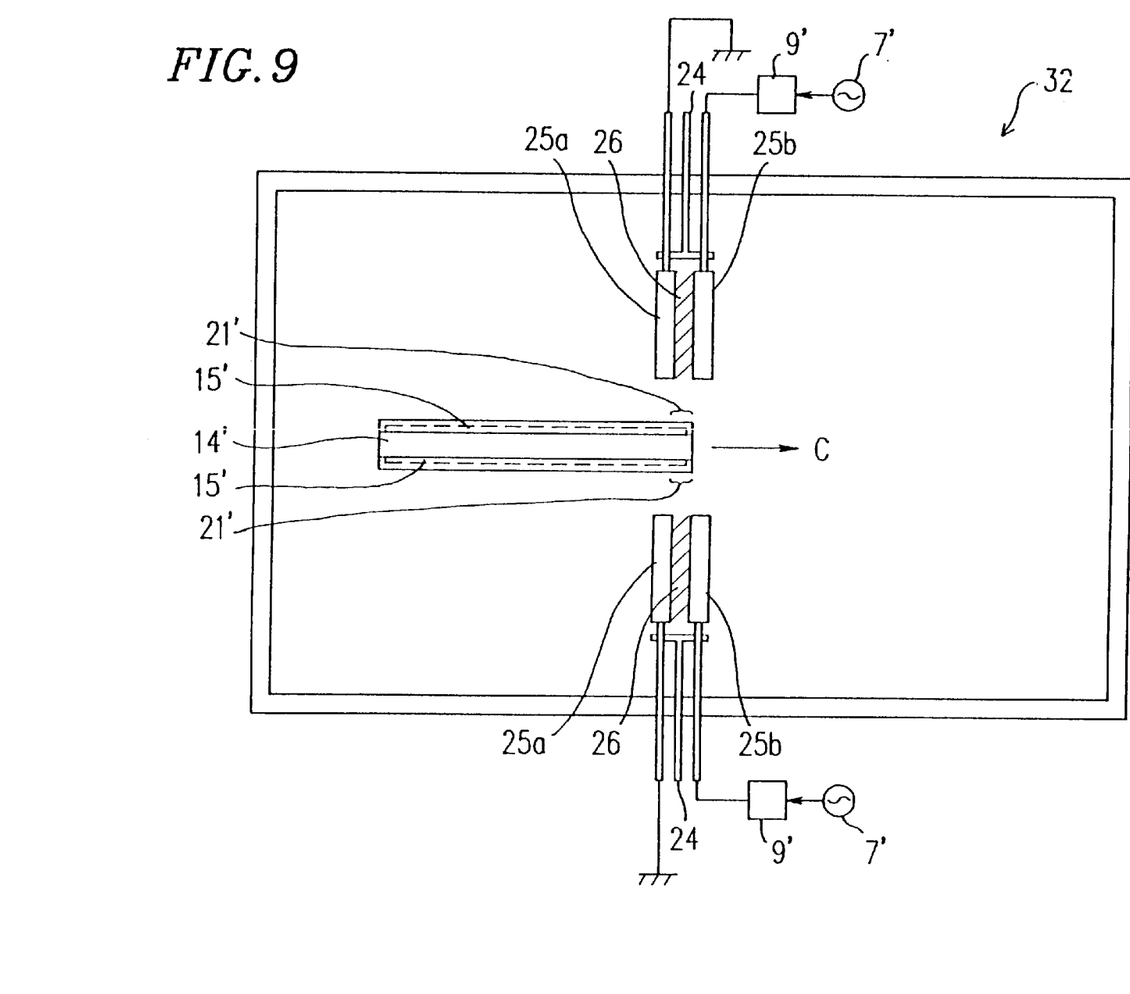
FIG. 9 is a cross-sectional view taken at line A—A in FIG. 8.
Figure 10:
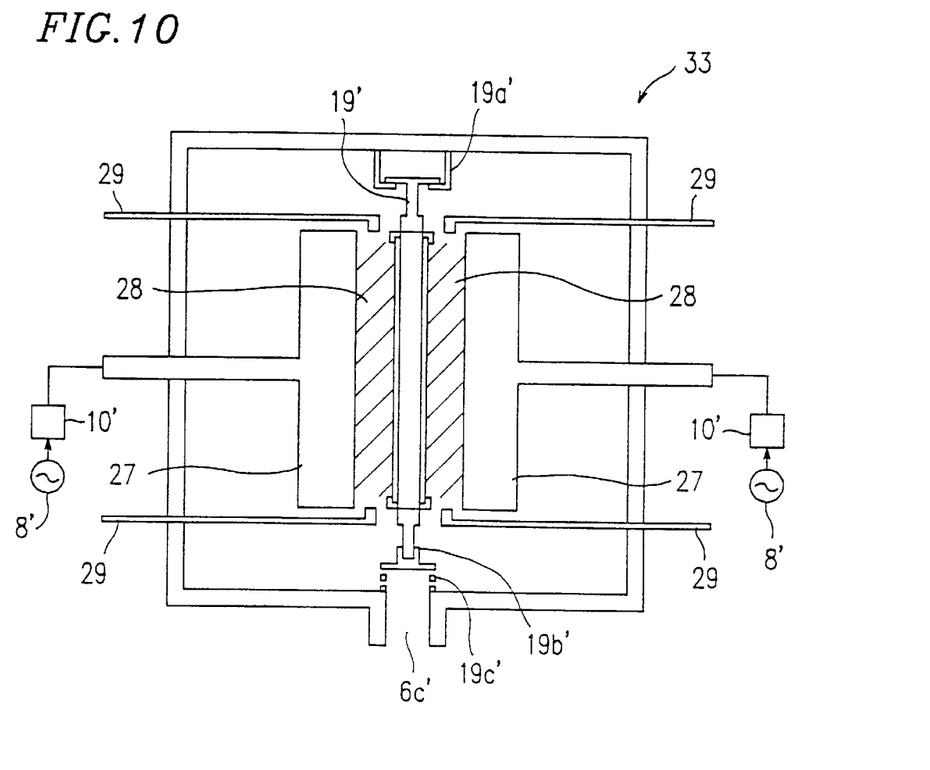
FIG. 10 illustrates the structure of a second vacuum chamber of the film formation device (sputtering device) according to Example 3 of the present invention.

FIG. 8 is a vertical cross-sectional view showing the structure of the first vacuum chamber 32. FIG. 9 is a cross-sectional view (as seen from above) taken at line A—A in FIG. 8. FIG. 10 is a vertical cross-sectional view showing the structure of the second vacuum chamber 33. The preparation chamber 31 is identical with the preparation chamber 1 of the film formation device 100 of Example 1.

As shown in FIGS. 7 to 8, a conveyer 19' is provided extending through the preparation chamber 31 and the vacuum chambers 32 and 33. The conveyer 19' carries substrates 15' into or out of the sputtering device 300, with the corresponding partition valves 5a' to 5d' opening or closing accordingly. As shown in FIGS. 8 and 10, the conveyer 19' includes a guide/support portion 19a' (located closer to the ceiling of the sputtering device 300), a bottom guide portion 19b' (located closer to the bottom of the sputtering device 300), and a heater 14'. The heater 14' includes an upper portion 14a' which is movably supported and guided by the guide/support portion 19a', and a lower portion 14b' which is guided by the guide portion 19b' at the bottom. A spring 19c' is provided beneath the guide portion 19b' for providing upward force for the guide portion 19b'. Thus, the heater 14' is movably supported by the guide/support portion 19a' and the bottom guide portion 19b'.

The guide/support portion 19a' and the bottom guide portion 19b' are formed so as to continuously extend from outside of the preparation chamber 31 to outside of the second vacuum chamber 33 (Only the guide/support portion 19a' is shown in FIG. 7 by a broken line). The heater 141 carries the substrates 15' on both faces thereof (as shown in FIG. 7), and has a general plate shape slightly larger than each substrate 15'. The heater 14' includes a predetermined means (not shown) for heating the substrates 15' disposed on the heater 14' to a predetermined temperature.

Although the sputtering device 300 of the present example is described as processing two substrates 15' simultaneously in each chamber, the present invention provides no limitation as to the number of substrates 15' to be processed at one time. For conciseness, the following description will primarily be directed to the processing of only one substrate 15' and various members of the device 300 associated therewith; it will be appreciated that the same description applies to the other substrate 15' and members associated therewith.

As shown in FIGS. 7 to 9, a pair of Al targets 25a and 25b are provided so as to oppose each other on each side of the conveyance path of the substrates 15' in the first vacuum chamber 32. The Al target 25b is coupled to an external high-frequency power supply 7' via a matching box 9'; the Al target 25a is grounded. As shown in FIGS. 8 and 9, a gas introduction tube 24 for introducing a reaction gas is provided in the first vacuum chamber 32. Each gas introduction tube 24 opens in a region between an inner wall of the first vacuum chamber 32 and the opposing Al targets 25a and 25b so as to be relatively close to the Al targets 25a and 25b.

As shown in FIG. 10, an Al target 27 is provided on each side of the conveyance path of the substrates 15' in the second vacuum chamber 33. The Al target 27 is coupled to an external high-frequency power supply 8' via a matching box 10'. As shown in FIGS. 7 and 10, the Al target 27 is formed so as to correspond to the entire face of the substrate 15'. As shown in FIG. 10, a gas introduction tube 29 for introducing a reaction gas between the Al target 27 and the substrate 15' is provided in the second vacuum chamber 33.

Next, an exemplary sputtering process on the substrate 15' using the sputtering device 300 will be described.

First, the conveyer 19' places the substrate 15' into the preparation chamber 31 (having a vacuum degree of about $10^{-5}$ Pa), and is heated to about 150° C. by the heater 14'.

Next, the conveyer 19' places the substrate 15' into the first vacuum chamber 32 (having a vacuum degree of about $10^{-5}$ Pa). After Ar gas is introduced into the first vacuum chamber 32 through the gas introduction tube 24, an electric field is generated between the opposing Al targets 25a and 25b, whereby a plasma 26 is generated (FIG. 9).

As shown in FIG. 9, the opposing Al targets 25a and 25b function to create a thin film (having a width 21') on the substrate 15'. According to the present example, the width 21' of the resultant thin film is about 80 mm when the film is formed while keeping the substrate 15' stationary. As will be appreciated, the plasma 26 is generated in a relatively small region in the first vacuum chamber 32, as compared with the entire area of the substrate 15' (FIG. 7).

In practice, the conveyer 19' moves the substrate 15' (along the conveyance path) between the stationary Al targets 25a and 25b at a rate of about 100 mm/min (as indicated by arrow C in FIG. 9), so that a thin film is formed over the entire surface of the substrate 15'. A film having a thickness of about 1000 angstroms can be obtained when the film formation process is performed for 5 minutes under a pressure of about 1 to about 10 Pa within the first vacuum chamber 32.

As seen from above, the plasma 26 is created in a relatively small region interposed between the Al targets 25a and 25b in the first vacuum chamber 32, so that the plasma 26 does not reach the vicinity of the substrate 15'. As a result, irradiation damage on the substrate 15' due to the plasma 26 is minimized, thereby reducing the damage occurring at an interface between the substrate 15' and the film formed on the substrate 15'.

After a thin film having a thickness of about 1000 angstroms has been formed in the first vacuum chamber 32 as described above, the conveyer 19' places the substrate 15' into the second vacuum chamber 33 having a vacuum degree of about $10^{-5}$ Pa. After Ar gas is introduced into the second vacuum chamber 33 through the gas introduction tube 29, a large-area plasma 28 is generated between the Al target 27 and the substrate 15'. Then, the substrate 15' is held stationary while an Al film is formed on the entire surface of the substrate 15'. In the second vacuum chamber 33, high-speed film formation takes place as a result of using the large-area plasma 28. A film having a thickness of about 2000 angstroms can be obtained when the film formation process in the second vacuum chamber 33 is performed for about 1 minute under a pressure of about 1 to about 10 Pa within the second vacuum chamber 33.

As described above, during the step of directly forming a film on the substrate 15' in the first vacuum chamber 32, the plasma 26 is generated in a region interposed between the Al targets 25a and 25b so that an Al film can be formed without damaging the surface of the substrate 15'. Subsequent to the step in the first vacuum chamber 32 where an Al film of a predetermined thickness is formed on the substrate 15', a high-speed film formation step occurs in the second vacuum chamber 33 using the large-area plasma 28 so that the processing time is reduced.

Moreover, in the sputtering device 300 of the present example, the partition valves 5a' to 5d' function to seal and isolate the preparation chamber 31 and the first and second vacuum chambers 32 and 33 from one another. Therefore, each chamber 31 to 33 can maintain the desired vacuum degree, as well as excellent gas isolation and plasma isolation. This makes it possible for the sputtering device 300 to simultaneously process three substrates 15' on each side of the conveyance path (each chamber 31 to 33 accommodating a different one of the three substrates 15'), totaling six substrates being simultaneously processed on both sides of the conveyance path.

EXAMPLE 4

An ultrasonic wave cleaning chamber can also be provided in the case where the film formation device of the invention is applied to a sputtering device, as in the case of the film formation device 200 of Example 2.

Figure 11:
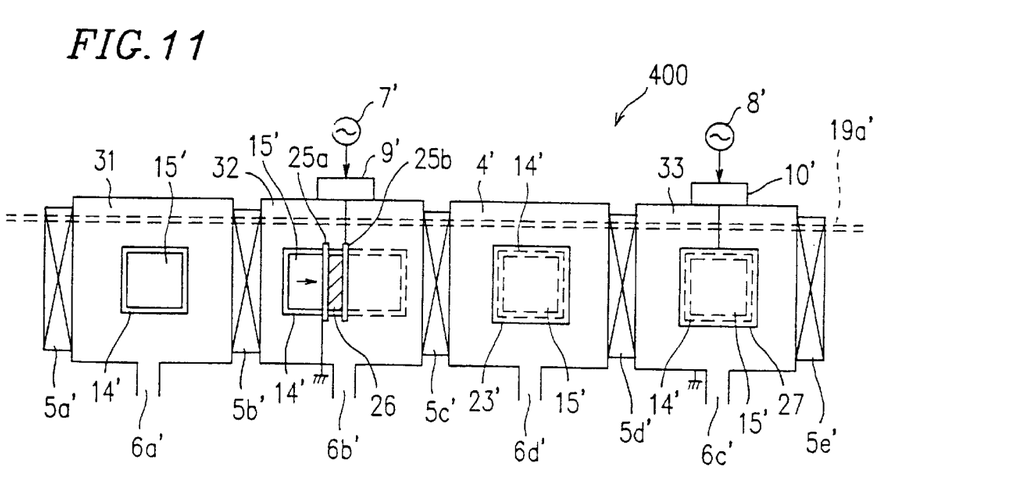
FIG. 11 is a schematic view showing a film formation device (sputtering device) according to Example 4 of the present invention.

FIG. 11 is a schematic view showing the configuration of the sputtering device 400 according to Example 4 of the present invention. The sputtering device 400 includes a preparation chamber 31, a first vacuum chamber 32, an ultrasonic wave cleaning chamber 4', and a second vacuum chamber 33. The actual sputtering process takes place in the first and second vacuum chambers 32 and 33. The sputtering device 400 has substantially the same construction as that of the sputtering device 300 except for additionally including the ultrasonic wave cleaning chamber 4' between the first and second vacuum chambers 32 and 33.

As shown in FIG. 11, the preparation chamber 31, the vacuum chambers 32 and 33, and the ultrasonic wave cleaning chamber 41 have vacuum openings 6a' to 6d', respectively, all of which open into a vacuum pump (not shown). As in Example 3, the preparation chamber 31, the vacuum chamber 32, the ultrasonic wave cleaning chamber 4', and the vacuum chamber 33 are connected to one another in series via partition valves 5b' to 5d' as shown in FIG. 11. A partition valve 5a' is provided on a side of the preparation chamber 31 opposite the first vacuum chamber 32. A similar partition valve 5e' is provided on a side of the second vacuum chamber 33 opposite the ultrasonic wave cleaning chamber 4'. The partition valves 5a' to 5e' are composed of stainless steel or aluminum and are capable of opening/closing. In an open state, each partition valve 5a' to 5e' functions as a passage connecting adjoining chambers. In a closed state, each adjoining pair of partition valves 5a' to 5e' functions to seal the corresponding chamber 31, 32, 33, or 4' located therebetween.

The preparation chamber 31 and the first and second vacuum chambers 32 and 33 of the sputtering device 400 are identical with the preparation chamber 31 and the first and second vacuum chambers 32 and 33 of the sputtering device 300 of Example 3.

In the sputtering device 400, a conveyer 19' is provided so as to extend at least from the preparation chamber 31 through the vacuum chamber 33. (Only a guide/support portion 19a' is shown in FIG. 11 by a broken line).

The ultrasonic wave cleaning chamber 4' is identical with the ultrasonic wave cleaning chamber 4 of the film formation device 200 of Example 2. Specifically, the ultrasonic wave cleaning chamber 4' accommodates a pair of ultrasonic wave cleaners 23', the ultrasonic wave cleaners 23' opposing respective substrates 15' carried along by the conveyer 19'. The ultrasonic wave cleaner 23' removes the residual reaction products on the surface of the substrates 15' after a film formation process in the first vacuum chamber 32.

Although the sputtering device 400 of the present example is described as processing two substrates 15' simultaneously in each chamber, the present invention provides no limitation as to the number of substrates 15' to be processed at one time. For conciseness, the following description will primarily be directed to the processing of only one substrate 15' and various members of the device 400 associated therewith; it will be appreciated that the same description applies to the other substrate 15' and members associated therewith.

In the present example (as well as in Example 3), the partition valves 5a' to 5e' function to seal and isolate the chambers 31, 32, 33, and 4' from one another. Therefore, each chamber 31, 32, 33 or 4' can maintain the desired vacuum degree, as well as excellent gas isolation and plasma isolation. This makes it possible for the sputtering device 400 to simultaneously process four substrates 15' on each side of the conveyance path (each chamber 31, 32, 33 or 4' accommodating a different one of the four substrates 15'), totaling eight substrates being simultaneously processed on both sides of the conveyance path.

Although the ultrasonic wave cleaning chamber 4' is provided between the vacuum chambers 32 and 33 in the present example, a further ultrasonic wave cleaning chamber can be provided after the second vacuum chamber 33.

The number of vacuum chambers is not limited to two according to the present invention. Any number of vacuum chambers can be provided in accordance with the specific needs of the sputtering process. In such cases, an ultrasonic wave cleaning chamber can be provided between any two vacuum chambers and in any position after the last vacuum chamber, if necessary.

Figure 12:
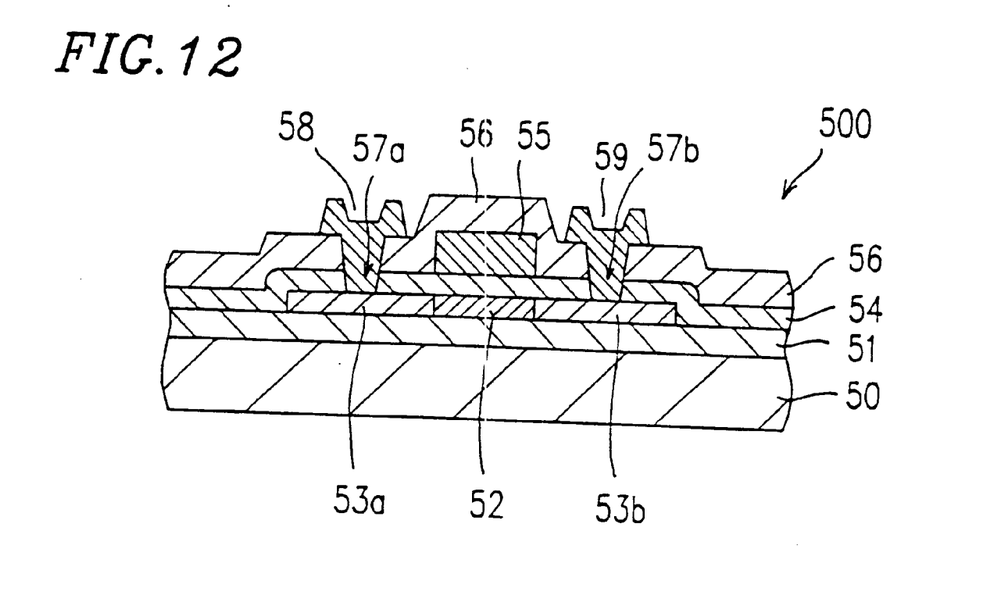
FIG. 12 is a cross-sectional view showing the structure of a TFT produced by using a film formation device according to the present invention.

FIG. 12 schematically shows a cross section of a TFT (thin film transistor) 500 produced by using the film formation device 100 of the present invention. The TFT 500 has the following characteristics:

fixed charge density: $2.1 \times 10^{11}/cm^2$ $V_{FB}$ shift: 1 V or less

As shown in FIG. 12, the TFT 500 includes a glass substrate 50, a base coating 51 formed on the glass substrate 50, a semiconductor film 52 formed on the base coating 51 so as to be interposed between contact layers 53a and 53b on both sides, a gate insulation film 54, a gate electrode 55, and an insulation film 56 formed so as to cover the gate electrode 55. Contact holes 57a and 57b are formed through the gate insulation film 54 and the insulation film 56 so as to reach the contact layers 53a and 53b, respectively. A source electrode 58 is formed so as to be connected to the contact layer 53a via the contact hole 57a. A drain electrode 59 is formed so as to be connected to the contact layer 53b via the contact hole 57b. The film formation device 100 according to Example 1 of the present invention is employed for the production process of the TFT 500 after the formation of the base coating 51. By producing the TFT 500 with the film formation device 300 (Example 3) or the sputtering device 400 (Example 4), the production yield of the TFT 500 can further improve due to reduction in the amount of particles.

As described above, in accordance with the film formation device of the present invention, a plurality of vacuum chambers are provided so that a film can be formed on a substrate in two separate steps to attain a predetermined thickness. First, in a first vacuum chamber, electrodes are disposed in such positions that an electric field is generated in a position where a substrate (or any material on which a film is to be formed) is prevented from sustaining substantial irradiation damage. After a plasma is generated in the first vacuum chamber, a reactive gas is introduced into the plasma, whereby a thin film is formed on the substrate. Thus, in the first vacuum chamber, the initial stage of thin film formation (during which the substrate is most likely to be damaged due to irradiation damage) is controlled so that substantially no damage occurs at the interface between the substrate and the resultant film. As a result, the generation of an interface state on the substrate surface is prevented. Thus, a semiconductor device having a stable threshold voltage can be produced, leading to an improved yield of satisfactory products.

After a thin film is formed on the substrate surface by generating a plasma in a position where the substrate does not sustain substantial irradiation damage, an electric field is generated in a second vacuum chamber at a position which allows a plasma to be generated in a relatively large area (by optimizing the positions of electrodes for generating such an electric field), thereby further growing the thin film on the substrate. As a result of such a high-speed film formation in the second vacuum chamber using a large-area plasma, a final thin film having a predetermined thickness is obtained. Thus, the throughput of the semiconductor device can be improved.

By providing an ultrasonic wave cleaning chamber between the first and second vacuum chambers, the residual reaction products generated during the step performed in the first vacuum chamber can be removed, thereby further improving the quality of the film.

The location of the ultrasonic wave cleaning chamber does not need to be after the first vacuum chamber for performing the initial film formation step. It is possible to provide an ultrasonic wave cleaning chamber after any vacuum chamber or after all of the vacuum chambers.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A film formation device for forming a film on a substrate, the film formation device comprising:

a plurality of vacuum chambers, each of the plurality of vacuum chambers including a gas introduction section for introducing a reactive gas, a plasma generation section for generating a plasma, and a support member for supporting the substrate, wherein the plurality of vacuum chambers comprise:
a first vacuum chamber in which the plasma generation section is disposed at a position for preventing the substrate from sustaining substantial irradiation damage by the generated plasma; and
a second vacuum chamber in which the plasma generation section is disposed so that the generated plasma directly irradiates a surface of the substrate.

2. A film formation device according to claim 1, wherein the plasma generation section in the first vacuum chamber includes an electric field generation section disposed between the gas introduction section and the support member in the vicinity of the gas introduction section, and the plasma is generated by an electric field generated by the electric field generation section, the plasma being generated in a position sufficiently distant from the substrate so as to prevent the substrate from sustaining substantial irradiation damage caused by the plasma.

3. A film formation device according to claim 2, wherein the first vacuum chamber includes a second gas introduction section for introducing a reactive gas between the electric field generation section and the support member.

4. A film formation device according to claim 1, wherein the plasma generation section in the first vacuum chamber generates the plasma in a width for forming the film smaller than a length of the substrate, and the support member includes a movable portion for moving the substrate with respect to the plasma generation section so that the film is formed on substantially the entire surface of the substrate as the moving portion moves.

5. A film formation device according to claim 1, wherein an ultrasonic wave cleaning chamber is provided following the first vacuum chamber, the ultrasonic wave cleaning chamber removing residual reaction products present on a surface of the film formed on the substrate.

* * * * *